United States Patent
Shin (10) Patent No.: US 7,710,034 B2
(45) Date of Patent: May 4, 2010

(54) CHASSIS INCLUDING METALLIC ELEMENT FOR DISSIPATING HEAT AND PLASMA DISPLAY MODULE HAVING THE SAME

(75) Inventor: Dong-Hyok Shin, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 753 days.

(21) Appl. No.: 11/585,514

(22) Filed: Oct. 24, 2006

(65) Prior Publication Data
US 2007/0103045 A1 May 10, 2007

(30) Foreign Application Priority Data
Nov. 7, 2005 (KR) .................. 10-2005-0106025

(51) Int. Cl.
*H01J 17/49* (2006.01)
(52) U.S. Cl. ........................ 313/582; 313/44
(58) Field of Classification Search ......... 313/582–587, 313/44–47
See application file for complete search history.

(56) References Cited

U.S. PATENT DOCUMENTS

| | | | |
|---|---|---|---|
| H526 H | 9/1988 | Miller | |
| 6,923,703 B2 | 8/2005 | Furukawa | |
| 7,436,654 B2 | 10/2008 | Cho | |
| 7,510,291 B2 | 3/2009 | Song et al. | |
| 2002/0195937 A1 | 12/2002 | Kim | |
| 2004/0036413 A1 | 2/2004 | Bae et al. | |
| 2005/0047068 A1 | 3/2005 | Kim | |
| 2005/0062383 A1* | 3/2005 | Bae | 313/44 |
| 2005/0067956 A1 | 3/2005 | Kim | |
| 2005/0088097 A1 | 4/2005 | Bae et al. | |
| 2005/0110407 A1* | 5/2005 | Kim | 313/582 |
| 2005/0194900 A1 | 9/2005 | Kim et al. | |
| 2005/0264198 A1 | 12/2005 | Woo et al. | |
| 2005/0285526 A1 | 12/2005 | Moon et al. | |
| 2006/0087233 A1 | 4/2006 | Kim et al. | |
| 2006/0109206 A1 | 5/2006 | Kim | |

(Continued)

FOREIGN PATENT DOCUMENTS

JP 2000-10492 1/2000

(Continued)

OTHER PUBLICATIONS

Second Office Action for Chinese Patent Application No. 200610006969.5 dated Feb. 27, 2009 by State Intellectual Property Office, P.R. China.

(Continued)

*Primary Examiner*—Nimeshkumar D. Patel
*Assistant Examiner*—Anne M Hines
(74) *Attorney, Agent, or Firm*—Knobbe Martens Olson & Bear LLP (57) ABSTRACT

A chassis for a plasma display module and a plasma display module having the same are disclosed. In one embodiment, the chassis for a plasma display module includes: a chassis base supporting a plasma display panel for displaying an image using a gas discharge and formed of plastics, and a metallic material distributed in each portion of the chassis base in different densities so that thermal conductivity can be different in each portion of the chassis base.

17 Claims, 6 Drawing Sheets

U.S. PATENT DOCUMENTS

2006/0164840 A1    7/2006    Song et al.

FOREIGN PATENT DOCUMENTS

| | | |
|---|---|---|
| JP | 2000-010493 | 1/2000 |
| JP | 2000-181370 | 6/2000 |
| JP | 2000-183572 | 6/2000 |
| JP | 2001-324942 | 11/2001 |
| JP | 2002-006756 | 1/2002 |
| JP | 2002-123178 | 4/2002 |
| JP | 2002-196683 | 7/2002 |
| JP | 2003-051684 | 2/2003 |
| JP | 2004-161918 | 6/2004 |
| JP | 2004-309544 | 11/2004 |
| KR | 10-2004-0024411 | 3/2004 |
| KR | 10-2006-0086218 | 7/2006 |

OTHER PUBLICATIONS

First Office Action for Chinese Patent Application No. 200610006969.5 dated Jul. 4, 2008.

Notice to Submit Response by Korean Intellectual Property Office on Sep. 22, 2006.

Notice of Allowance for U.S. Appl. No. 11/504,135 dated Sep. 4, 2009.

Notice of Allowance for U.S. Appl. No. 11/338,387 dated Sep. 24, 2009.

* cited by examiner

CHASSIS INCLUDING METALLIC ELEMENT FOR DISSIPATING HEAT AND PLASMA DISPLAY MODULE HAVING THE SAME

This application claims the priority of Korean Patent Application No. 10-2005-0106025, filed on Nov. 7, 2005, in the Korean Intellectual Property Office, the disclosure of which is incorporated herein in its entirety by reference. This application also relates to U.S. patent application Ser. No. 11/338,387 entitled "Plasma display device," filed on Jan. 24, 2006, which is incorporated herein in its entirety by reference.

BACKGROUND OF THE INVENTION

1. Field of the Invention

The present invention relates to a plasma display module, and more particularly, to a plastic chassis in which distribution of a metallic element for dissipating heat is changed in each portion of the plastic chassis so that heat dissipation can be effectively performed, and a plasma display module having the same.

2. Description of the Related Art

Plasma display modules are flat display devices for displaying an image using a gas discharge. Plasma display modules can be made thin and a high-quality large screen having a wide viewing angle and thus have come into the spotlight as large flat display devices.

A plasma display module includes a chassis base to support a plasma display panel (PDP) and a circuit board, etc.

In general, a chassis is formed of metal such as aluminum (Al) having good thermal conductivity and has a flat rectangular shape with which the entire surface of the PDP is covered, so as to perform the function for supporting a high-weight plasma display panel and dissipating heat generated in the PDP during operation.

Thus, the weight of the chassis base in the plasma display module is considerably larger.

To address the problem, the chassis base can be manufactured using plastics which are lighter than metal. However, a heat-dissipating characteristic of the chassis formed of plastics is inferior compared to a chassis formed of metal. In addition, both i) a portion in which a large amount of heat should be dissipated and ii) a portion in which a large amount of heat needs not be dissipated have the same thermal conductivity so that heat dissipation is not effectively performed.

SUMMARY OF CERTAIN INVENTIVE ASPECTS

One aspect of the present invention provides a chassis in which a metallic element is distributed in each portion of the chassis formed of plastics in different densities so that thermal conductivity can be improved and heat dissipation can be effectively performed, and a plasma display module having the same Another aspect of the present invention provides a chassis for a plasma display module, the chassis comprising: a chassis base supporting a plasma display panel for displaying an image using a gas discharge and formed of plastics, and a metallic element distributed in each portion of the chassis base in different densities so that thermal conductivity can be different in each portion of the chassis base.

The metallic element may be distributed in a higher density in a horizontal portion of the chassis base including a portion of the chassis base having a circuit board in which a large amount of heat is generated. The circuit board in which a large amount of heat is generated, may be a switching module power supply (SMPS) for supplying power to a circuit board for driving a plasma display module.

The metallic element may be a metallic powder or a metallic fiber contained in the chassis base.

The metallic element may be a tape including a metallic fiber and the tape is combined with at least one surface of the chassis base.

The metallic element may be at least one layer of fabric sheet, the fabric sheet being combined with one surface of the chassis base and being weaved in a plain weave manner using latitudinal and longitudinal threads formed of metal.

Another aspect of the present invention provides a plasma display module comprising: a plasma display panel displaying an image using a gas discharge, a chassis, the chassis comprising: a chassis base supporting a plasma display panel for displaying an image using a gas discharge and formed of plastics and a metallic element distributed in each portion of the chassis base in different densities so that thermal conductivity can be different in each portion of the chassis base and a circuit board combined with the chassis and driving the PDP.

BRIEF DESCRIPTION OF THE DRAWINGS

The above and other aspects of the present invention will become more apparent by describing in detail exemplary embodiments thereof with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

Figure 1:
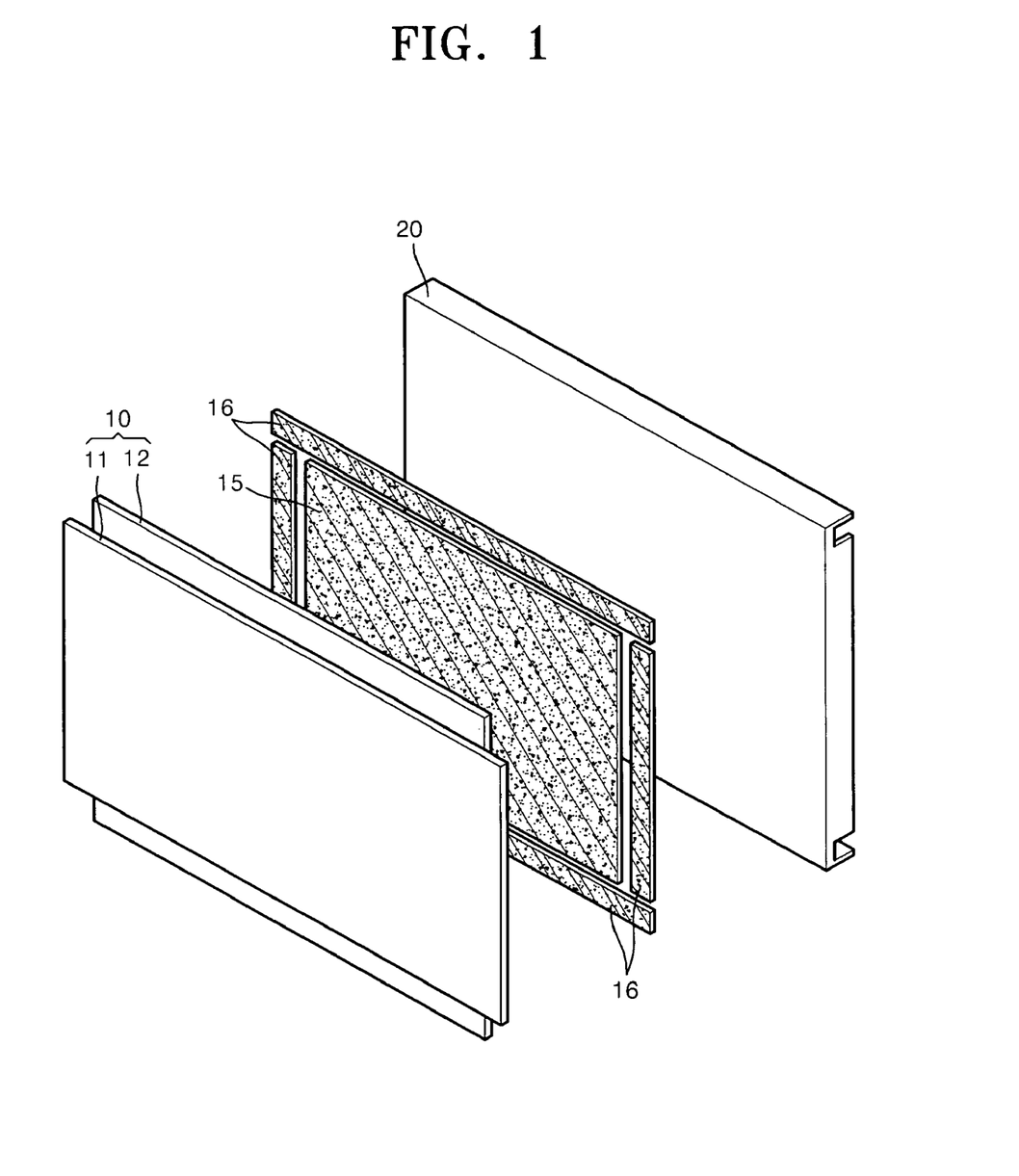
FIG. 1 is a schematic partially exploded perspective view of a plasma display module having a chassis according to an embodiment of the present invention.

FIG. 1 is a schematic partially exploded perspective view of a plasma display module having a chassis according to an embodiment of the present invention. Referring to FIG. 1, a heat conductive sheet 15 is interposed between a plasma display panel (PDP) 10 having a front panel 11 and a rear panel 12, and a chassis 20. An adhesive member, such as a dual adhesive tape 16, is disposed along edges of the heat conductive sheet 15. The PDP 10 and the chassis 20 are combined with each other so that they are pressurized in their own combination direction and adhered to each other.

Figure 2:
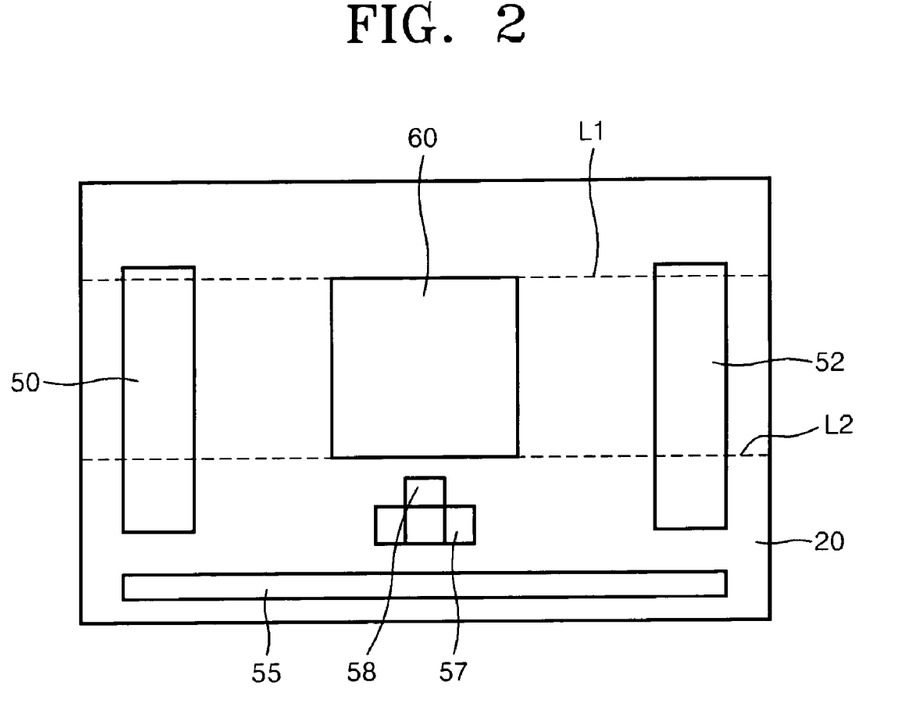
FIG. 2 shows a general arrangement of a plurality of driving circuit boards arranged on the chassis.

FIG. 2 shows a general arrangement of a plurality of driving circuit boards combined on one surface of the chassis 20. Referring to FIG. 2, a plurality of driving circuit boards for driving the PDP 10 are disposed on a surface of the chassis 20 opposite surface to a surface on which the PDP 10 is adhered.

In general, the chassis 20 includes: an image board 58 combined at a rear side of the chassis 20, receiving an image signal transmitted from the outside and processing the received image signal, an X electrode driving board 52 being electrically coupled to X electrodes of the PDP 10 and dividing and applying driving signals to the X electrodes, respectively and a Y electrode driving board 50 being electrically coupled to Y electrodes of the PDP 10 and dividing and applying driving signals to the Y electrodes, respectively. The chassis 20 may also include i) an address electrode driving board 55 being electrically connected to address electrodes of the PDP 10 and dividing and applying driving signals to the address electrodes, ii) a logic board 57 receiving the image signal processed by the image board 58, generating a driving signal corresponding to the image signal, and transmitting the driving signal to the Y, X and address electrode driving boards 50, 52 and 55, and iii) a power supply board 60 supplying power to the image board 58, the three electrode driving boards 50, 52 and 55, and the logic board 57, respectively.

In general, the X electrode driving board 52, the Y electrode driving board 50, and the address electrode driving board 55 are disposed on left, right and lower sides of the chassis 20, respectively (see FIG. 2), adjacent to terminals of the X electrodes, the Y electrodes, and the address electrodes. The power supply board 60 is located in a generally center area of the chassis 20. The power supply board 60 may be a switching module power supply (SMPS).

The circuit boards and the PDP 10 are electrically coupled to each other by a signal transmission means such as a tape carrier package (TCP).

In addition, bosses (not shown) for combining the driving circuit boards and reinforcement members (not shown) for reinforcing rigidity of the chassis 20 may be provided on a rear surface of the chassis 20.

The chassis 20 supports the PDP 10 and the driving circuit boards, etc. The chassis 20 dissipates heat generated in the PDP 10 during operation and transmitted through the heat conductive sheet 15.

The chassis 20 may be mainly formed of plastics to reduce weight and to easily form various shapes. The chassis 20 may be formed of a composite material in which a reinforcement fiber such as a glass fiber or carbon fiber is added, so as to reinforce strength.

Generally, it is difficult to dissipate heat in a central portion A of the chassis 20 due to position, and the fact that the SMPS for generating a large amount of heat is located near the portion A of the chassis 20.

Figure 3:
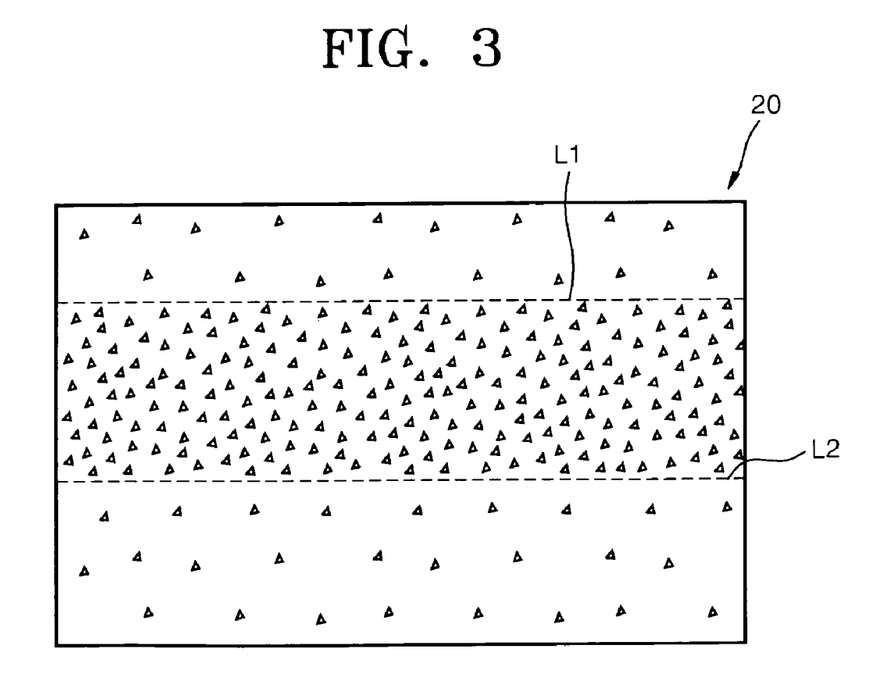
FIG. 3 illustrates a chassis where a metallic element is distributed in different densities in each portion of the chassis according to an embodiment of the present invention.

FIG. 3 illustrates a chassis where a metallic element is distributed in different densities in each portion of the chassis. In one embodiment, in a portion of the chassis corresponding to horizontal layers L1 and L2 including the SMPS 60, are contained more dense metallic elements as shown in FIG. 3.

Figure 4:
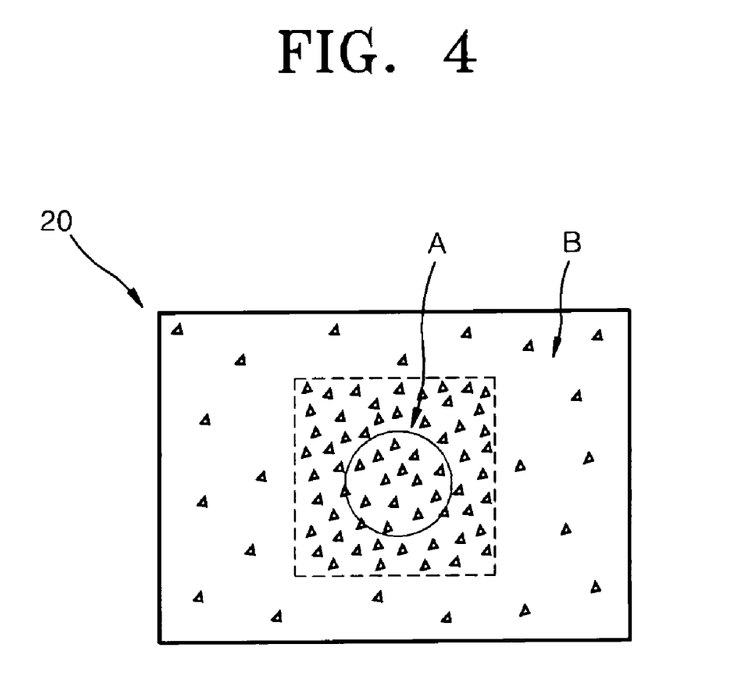
FIG. 4 illustrates a chassis where a metallic element is distributed in different densities in each portion of the chassis according to another embodiment of the present invention.

FIG. 4 illustrates a chassis where a metallic element (or material) is distributed in different densities in each portion of the chassis according to another embodiment of the present invention. Referring to FIG. 4, a large amount of heat is generated in a region A including the SMPS. In one embodiment, a larger amount of metallic powder or metallic fiber is distributed in the region A compared to a region B. In this embodiment, a large amount of heat can be efficiently dissipated in the region A since thermal conductivity in the region A is higher than those of other portions (e.g., region B in FIG. 4) of the chassis 20. In another embodiment, a metallic material having higher thermal conductivity may be distributed in the region A whereas a metallic material having lower thermal conductivity may be distributed in other regions such as the region B.

Figure 5:
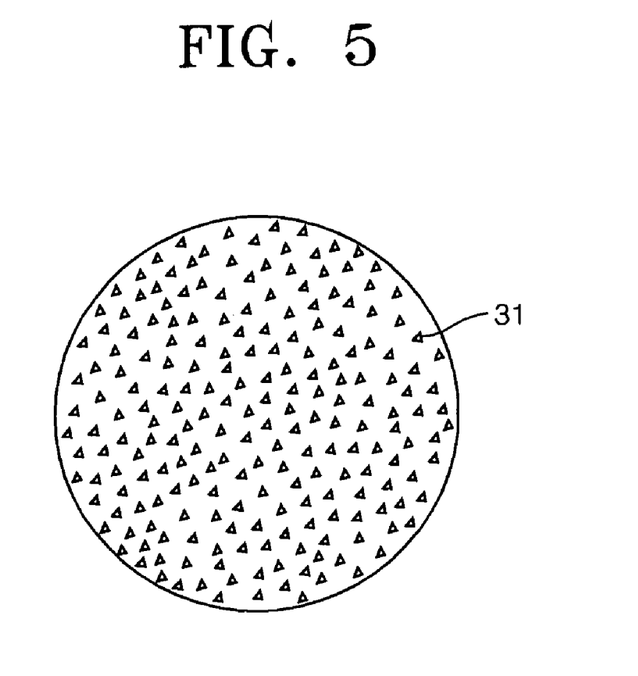
FIG. 5 is an enlarged view of region A drawn in FIG. 4 where metallic powder is distributed in the plastic chassis.
Figure 6:
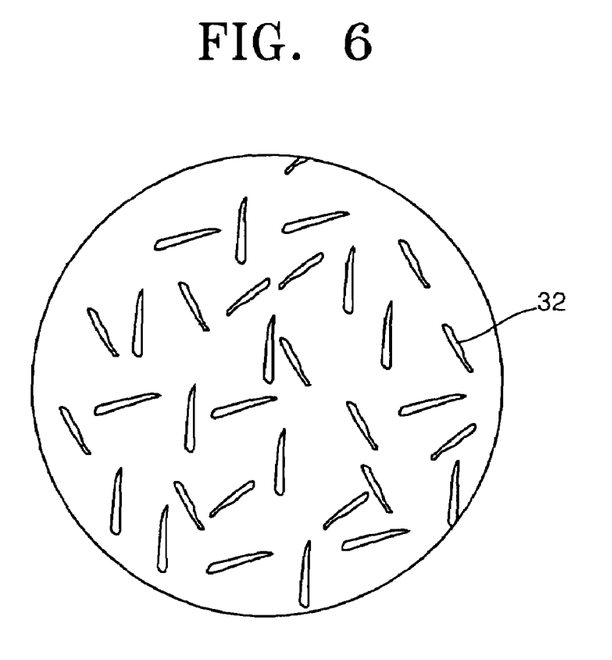
FIG. 6 is an enlarged view of region A drawn in FIG. 4 where a metallic fiber is distributed in the plastic chassis.

FIG. 5 is an enlarged view of region A drawn in FIG. 4 where a metallic powder 31 is distributed in the plastic chassis, and FIG. 6 is an enlarged view of region A drawn in FIG. 4 where a metallic fiber 32 is distributed in the plastic chassis.

The metallic fiber 32 may be formed of metal having high thermal conductivity such as copper (Cu) or aluminum (Al). The metallic powder 31 may be formed of metal such as gold (Au), silver (Ag), Cu, Al or graphite, etc.

As an embodiment for manufacturing the chassis 20 using a composite material in which the metallic element 31 or 32 is distributed, there is a method by which the composite material is put in a hopper, pressurized and heated and then injected in a mold using nozzles and cooled down.

In one embodiment, since the amount of the metallic elements 31 and 32 to be added to plastics is different, a multiple-injection method having the number of multiple nozzles corresponding to the number of different materials is used so that the chassis 20 having partially different conductivity can be manufactured.

Accordingly, the portion in which a large amount of heat should be dissipated, like the region A, is made by injecting a material in which a large amount of the metallic fiber 32 or the metallic powder 31 is contained. As such, heat dissipation efficiency can be improved. In another embodiment, a metallic material having higher thermal conductivity may be injected in the region A whereas a metallic material having lower thermal conductivity may be injected in other regions such as the region B.

Figure 7:
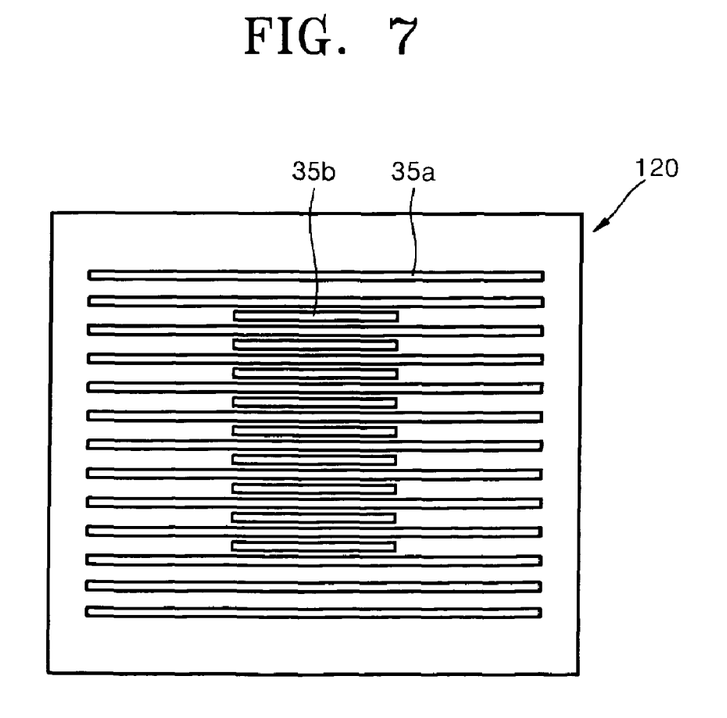
FIG. 7 is a schematic view of a chassis including tapes in which a metallic fiber is reinforced, according to another embodiment of the present invention.

An embodiment for manufacturing a chassis 120 in which a metallic element is distributed in each portion of the chassis 120 in different densities will now be described.

FIG. 7 is a schematic view of the chassis 120 including tapes 35*a* and 35*b* having a reinforced metallic fiber 32 according to another embodiment of the present invention. In one embodiment, as shown in FIG. 7, a metallic fiber or metallic powder, which is a reinforcement material, for improving thermal conductivity is added to the tapes 35*a* and 35*b* attached to a surface in which the chassis 120 is adhered to the PDP 10. The metallic tapes 35*a* and 35*b* may be attached to a surface of the chassis 120 on which the driving circuit board is located or both surfaces of the chassis base 120.

In one embodiment, the tape 35*a* is attached to one surface of the chassis 120 in a row and the tape 35*b* is attached to be closer to a portion in which a large amount of heat should be dissipated. Although not shown, the tapes 35*a* and 35*b* having the reinforced metallic fiber 32 can be attached to be closer to the horizontal layers L1 and L2 shown in FIG. 3.

Figure 8:
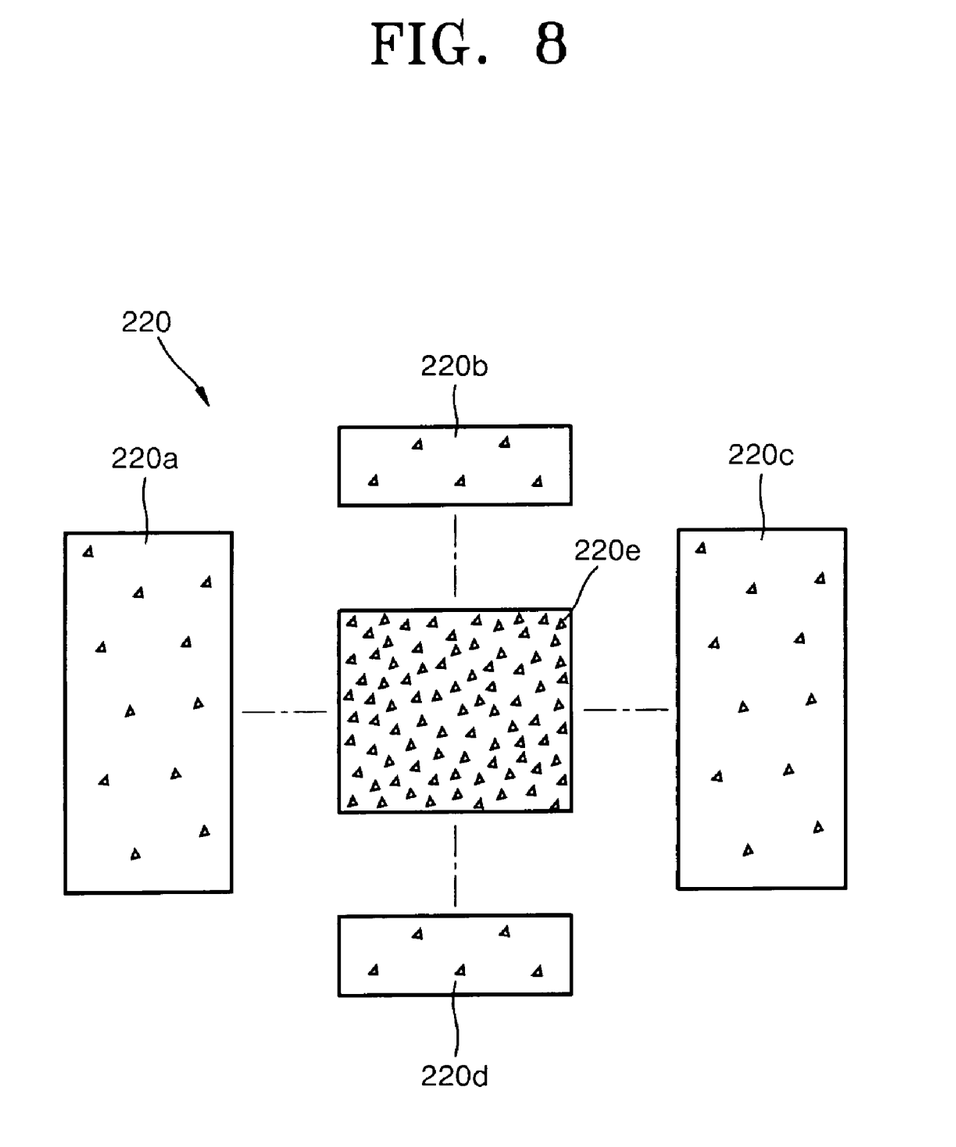
FIG. 8 is a schematic view of pieces of respective chassis in which a metallic element is distributed in different densities, according to another embodiment of the present invention.

Another embodiment for manufacturing a chassis 220 in which a metallic element is distributed in each portion of the chassis 220 in different densities will now be described.

Referring to FIG. 8, a metallic element density of a central portion 220*e* is larger than a metallic element density of peripheral portions 220*a*, 220*b*, 220*c*, and 220*d*. In one embodiment, the metallic element density may be different in each of the peripheral portions 220*a*, 220*b*, 220*c*, and 220*d*. The injecting method described in the embodiment shown in FIG. 7 can be used as method of distributing the metallic element in the chassis 220.

In one embodiment, each of the peripheral portions 220a, 220b, 220c, and 220d is separately formed using methods such as injection, etc. and then combined with each other. In another embodiment, the central portion 220e and the peripheral portions 220a, 220b, 220c, and 220d are separately formed using methods such as injection, etc. and then combined with each other.

In the method of combing the portions, a hook may be inserted in a combined portion, or heat may be applied to both surfaces of the chassis 220 to be combined so that both surfaces of the chassis 220 can be pressurized. By using the method, the portions are separately injected and combined without using an injection molding device having multiple nozzles. Thus, the chassis 220 in which a metallic element is distributed in each portion in different densities is manufactured such that heat dissipation efficiency is improved.

Although not shown, in order to manufacture the chassis 20 shown in FIG. 3, upper-, medium-, and lower-layer chassis may be firstly manufactured using the above-described method and then, the hook may be inserted in a portion in which portions of the chassis 20 are combined or heat may be applied to both surfaces of the chassis 20 to be combined and pressurized, as described above.

Figure 9:
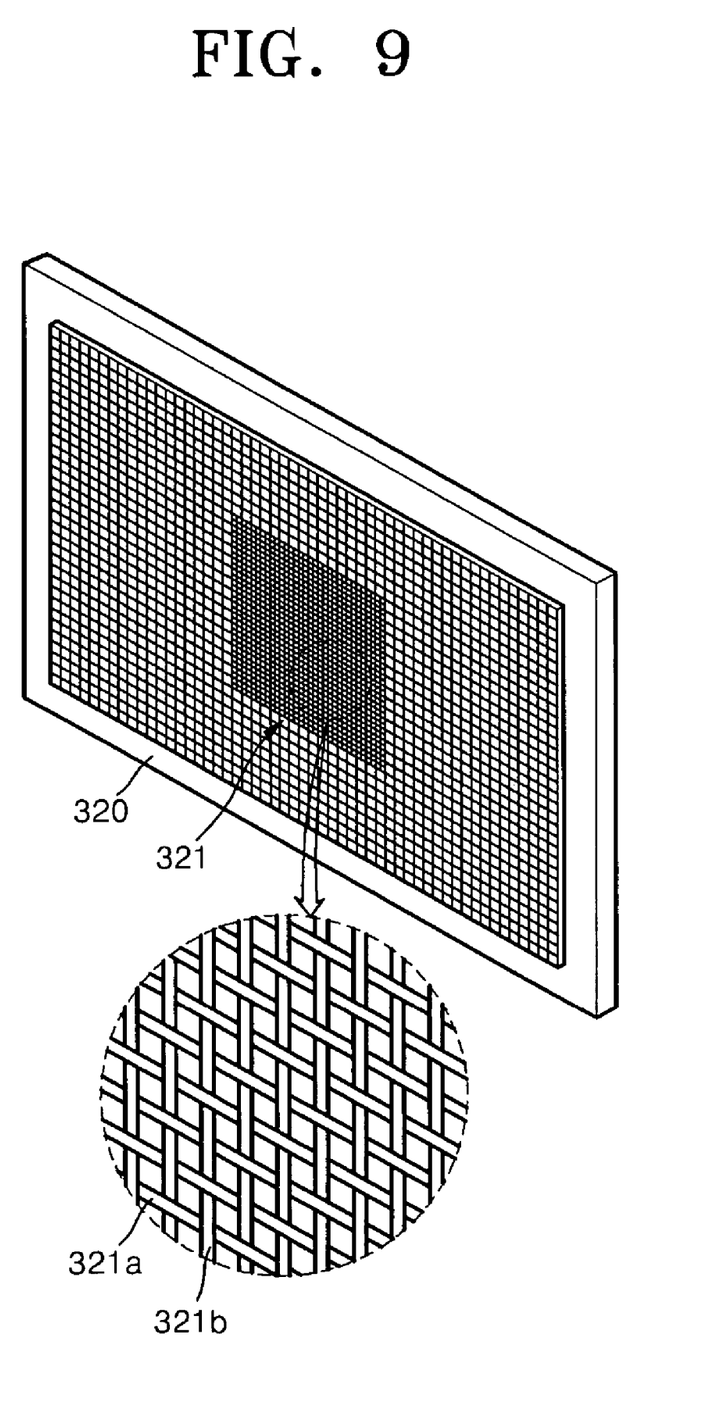
FIG. 9 is a schematic perspective view of a chassis in which a metallic fabric sheet is combined in each portion of the chassis base in different densities, according to another embodiment of the present invention.

Another embodiment for manufacturing a chassis 320 in which a metallic element is distributed in each portion of the chassis 320 in different densities will now be described. Referring to FIG. 9, a fabric sheet 321 formed of a metallic thread is combined with a surface (a front surface) of a PDP of the chassis 320.

In one embodiment, a latitudinal thread 321a including a copper (Cu) thread and a longitudinal thread 321b are weaved in a plain weave manner so that the fabric sheet 321 can be formed. A plurality of Cu threads may be twisted so that the latitudinal thread 321a and the longitudinal thread 321b can be formed. In an enlarged view of FIG. 9, the latitudinal thread 321a and the longitudinal thread 321b may be weaved to be alternatively displaced in upward and downward directions by one strand and to cross each other.

A fineness of the fabric sheet 321 to be combined with the portion in which a large amount of heat should be dissipated is larger than a fineness of the fabric sheet 321 to be combined with the portion in which a large amount of heat needs not to dissipated. As such, heat generated in the PDP 10 and transmitted through the heat conductive sheet 15 can be quickly transmitted through the copper threads 321a and 321b formed of metal.

In one embodiment, a plurality of layers of fabric sheet 321 are stacked and then stitched so that the fabric sheet 321 can be formed in one unit. Of course, a plurality of layers of fabric sheet 321 may also be stacked so that the fabric sheet 321 can be formed. However, from the beginning, the latitudinal thread 321a including a Cu thread and the longitudinal thread 321 may be formed in a three-dimensional shaped fabric so that the fabric sheet 321 can be formed.

In order to easily combine the fabric sheet 321 and the chassis 320, a material characteristic of the chassis 320 can be used. That is, since the chassis 320 is formed of plastics, baking deformation can be freely performed by heat. Thus, the fabric sheet 321 is heated at a sufficient temperature to melt at least a part of a surface of the chassis 320 and then, the heated fabric sheet 321 is pressurized on the surface of the chassis 320 and cured so that a chassis for a PDP in which the chassis 320 and the fabric sheet 321 are formed in one unit can be manufactured.

The operation and effect of the chassis in which the metallic element is distributed in each portion of the chassis in different densities, as described above, will now be described.

If a plasma discharge occurs, heat is generated in the PDP 10, and the heat is transmitted to the chassis 20 through the heat conductive sheet 15 interposed between the PDP 10 and the chassis 20, 120, 220, and 320. Compared to other portions of the chassis 20, a larger amount of a metallic element such as a metallic fiber or metallic powder or a metallic tape or metallic fabric sheet is distributed in the portion (the region A) of the chassis 20 formed of plastics in which a large amount of heat is generated and heat is not smoothly dissipated.

Accordingly, heat transmitted through the heat conductive sheet 15 is more quickly transmitted through the metallic element in the portion in which a large amount of a metallic element is distributed. Thus, heat dissipation is also quickly performed such that heat dissipation efficiency is improved.

As described above, in the chassis and the plasma display module having the same according to embodiments of the present invention, a plastic chassis having different densities of a metallic element in each portion of the chassis is provided to improve thermal conductivity of the portion in which a large amount of heat should be dissipated.

Thus, heat dissipation efficiency can be increased in the plastic chassis having light weight and complicated shape.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A chassis for a plasma display module, the chassis comprising:
    a chassis base configured to support a plasma display panel, wherein the chassis base is mainly formed of plastic; and
    a metallic material that is unevenly distributed in or on the chassis base, wherein the metallic material is a metallic powder and the metallic powder is mixed into the plastic.

2. The chassis for a plasma display module of claim 1, wherein the metallic material has a higher density in a portion of the chassis base where a circuit board is located than the remaining portion of the chassis base.

3. The chassis for a plasma display module of claim 2, wherein the circuit board is a switching module power supply (SMPS) configured to supply power to at least one driving circuit board.

4. A chassis for a plasma display module, the chassis comprising:
    a chassis base configured to support a plasma display panel, wherein the chassis base is mainly formed of plastic; and
    a metallic material that is unevenly distributed in or on the chassis base, wherein the metallic material is a metallic fiber and the metallic fiber is mixed into the plastic.

5. A chassis for a plasma display module, the chassis comprising:
    a chassis base configured to support a plasma display panel, wherein the chassis base is mainly formed of plastic; and
    a metallic material that is unevenly distributed in or on the chassis base, wherein the metallic material is a tape including a metallic fiber and the tape is attached to at least one surface of the chassis base.

6. A chassis for a plasma display module, the chassis comprising:
   a chassis base configured to support a plasma display panel, wherein the chassis base is mainly formed of plastic; and
   a metallic material that is unevenly distributed in or on the chassis base, wherein the metallic material is at least one layer of fabric sheet and the fabric sheet is attached to one surface of the chassis base and weaved in a plain weave manner using latitudinal and longitudinal threads formed of metal.

7. A plasma display module, comprising:
   a plasma display panel (PDP) configured to display an image using a gas discharge;
   a chassis which includes:
      a chassis base configured to support the PDP, wherein the chassis base is mainly formed of plastic; and
      a metallic material distributed in or on the chassis base in different densities so that thermal conductivity differs across the chassis base; and
   a circuit board located on the chassis base and configured to drive the PDP, wherein the metallic material is a metallic powder or metallic fiber integrated into the plastic of the chassis base.

8. The plasma display module of claim 7, wherein the metallic material has a higher density in a portion of the chassis base where the circuit board is formed than the remaining portion of the chassis base.

9. The plasma display module of claim 8, wherein the circuit board is a switching module power supply (SMPS) configured to supply power to at least one driving circuit board.

10. The plasma display module of claim 7, wherein the metallic material has a higher density in a generally central area of the chassis base than the peripheral areas of the chassis base.

11. A plasma display module, comprising:
   a plasma display panel (PDP) configured to display an image using a gas discharge;
   a chassis which includes:
      a chassis base configured to support the PDP, wherein the chassis base is mainly formed of plastic; and
      a metallic material distributed in or on the chassis base in different densities so that thermal conductivity differs across the chassis base; and
   a circuit board located on the chassis base and configured to drive the PDP, wherein the metallic material is a tape including a metallic fiber and the tape is attached to at least one surface of the chassis base.

12. A plasma display module, comprising:
   a plasma display panel (PDP) configured to display an image using a gas discharge;
   a chassis which includes:
      a chassis base configured to support the PDP, wherein the chassis base is mainly formed of plastic; and
      a metallic material distributed in or on the chassis base in different densities so that thermal conductivity differs across the chassis base; and
   a circuit board located on the chassis base and configured to drive the PDP, wherein the metallic material is at least one layer of fabric sheet and the fabric sheet is attached to one surface of the chassis base and weaved in a plain weave manner using latitudinal and longitudinal threads formed of metal.

13. A chassis for a plasma display module, the chassis comprising:
   a chassis base configured to support a plasma display panel via a surface thereof, wherein the chassis base is formed of plastic and at least one conductive material, and wherein the at least one conductive material is provided in or on the chassis base such that the thermal conductivity of at least one part of the surface of the chassis base differs from the remaining parts of the chassis base, wherein the at least one conductive material includes a plurality of conductive materials having different thermal conductivities.

14. The plasma display module of claim 13, wherein the at least one conductive material is a metallic material unevenly distributed in density in or on the chassis base.

15. The plasma display module of claim 14, wherein the metallic material has a higher density in the part of the chassis base where a driving circuit board is to be located than the rest of the chassis base.

16. The plasma display module of claim 13, wherein the conductive material having comparatively higher thermal conductivity is provided in or on the part of the chassis base where a driving circuit board is to be located.

17. The plasma display module of claim 13, wherein a central region of the chassis base has a higher thermal conductivity than a peripheral region of the chassis base.

* * * * *